United States Patent [19]
Weitzel et al.

[11] Patent Number: 5,399,887
[45] Date of Patent: Mar. 21, 1995

[54] MODULATION DOPED FIELD EFFECT TRANSISTOR

[75] Inventors: Charles E. Weitzel, Mesa, Ariz.; Neal Mellen, Corrales, N. Mex.; Kenneth L. Davis, Tempe; Paige Holm, Phoenix, both of Ariz.

[73] Assignee: Motorola, Inc., Schaumburg, Ill.

[21] Appl. No.: 238,081

[22] Filed: May 3, 1994

[51] Int. Cl.$^6$ .................. H01L 29/161; H01L 29/205; H01L 29/225
[52] U.S. Cl. ...................... 257/194; 257/192; 257/280; 257/285
[58] Field of Search ................ 257/192, 194, 280, 285

[56] References Cited

U.S. PATENT DOCUMENTS

| | | |
|---|---|---|
| 4,710,788 | 12/1987 | Dambkes et al. .................... 257/194 |
| 4,805,003 | 2/1989 | Holm et al. . | |
| 5,077,589 | 12/1991 | Holm et al. . | |
| 5,323,030 | 6/1994 | Koscica et al. ..................... 257/194 |
| 5,334,865 | 8/1994 | Fathimulla et al. ................. 257/192 |

*Primary Examiner*—Ngân V. Ngô
*Attorney, Agent, or Firm*—Robert F. Hightower; Eugene A. Parsons

[57] ABSTRACT

A modulation doped field effect transistor (10) is formed to have a drain (28, 12, 11) that is vertically displaced from the source (16, 17) and channel (20, 21) regions. The transistor (10) has the source (16, 17), channel (20, 21) and a portion of the drain (28) arranged laterally so that current (27) flows from the source (16, 17) laterally to the drain (28, 12, 11). A heterojunction layer (18) on the channel region (20, 21) facilitates forming a two dimensional electron gas in the channel (20, 21) region which provides the transistor (10) with a high transconductance.

17 Claims, 1 Drawing Sheet

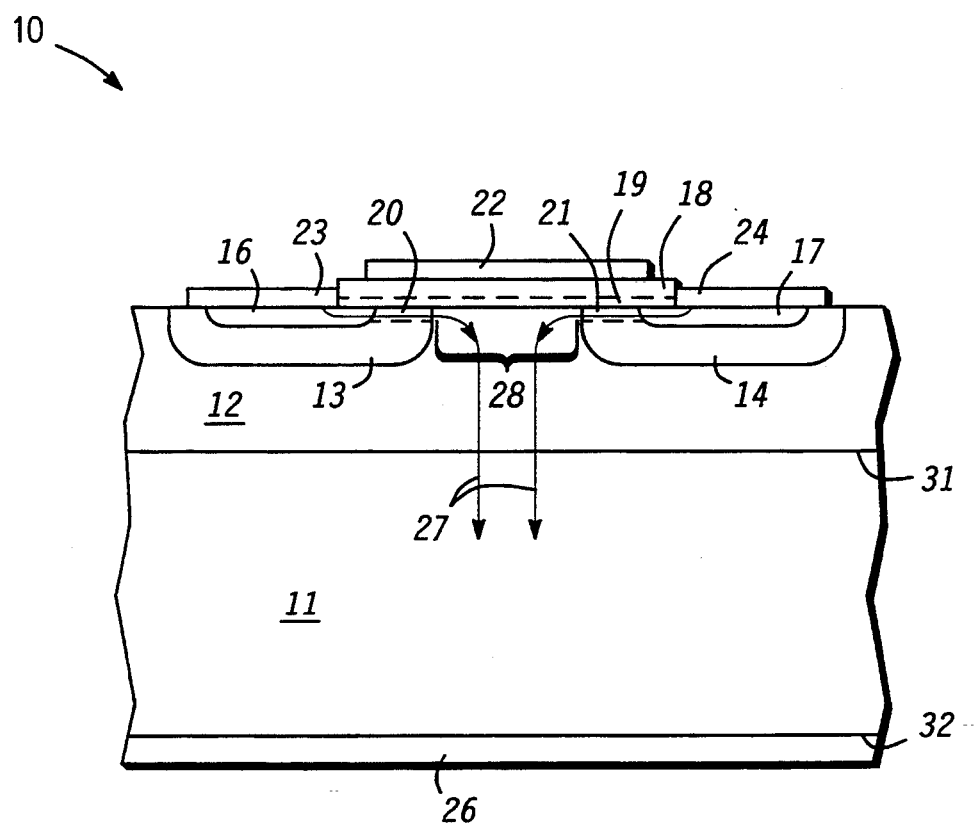

MODULATION DOPED FIELD EFFECT TRANSISTOR

BACKGROUND OF THE INVENTION

The present invention relates, in general, to semiconductors, and more particularly, to a novel semiconductor device.

Modulation doped field effect transistors (MODFETs) also known as high electron mobility transistors (HEMTs), are well known in the semiconductor industry. MODFETs and HEMTs have high gain and high frequency performance and generally are used in applications requiring these characteristics. Such transistors generally have the source, gate, and drain in close proximity to one another in order to maintain the high frequency and high performance characteristics. One problem with the prior transistor structures is the breakdown voltage and current handling capability of the devices. Because of the close proximity between the source, gate, and drain, the breakdown voltage typically has a maximum value that is less than approximately 10 volts. Also, the current density achievable with the prior devices is low because current flow is limited to one channel per gate. Consequently, such transistors generally are not suitable for applications requiring high power handling capabilities.

Accordingly, it is desirable to have a high performance power device that has a high breakdown voltage, and a high current density.

BRIEF DESCRIPTION OF THE DRAWINGS

The Sole FIGURE illustrates an enlarged cross-sectional view of a field effect transistor in accordance with the present invention.

DETAILED DESCRIPTION OF THE DRAWINGS

The Sole FIGURE illustrates an enlarged cross-sectional view of a field effect transistor 10 that has a high breakdown voltage and is capable of supporting large current densities. Transistor 10 includes a substrate 11 that has a first surface 31 and a second surface 32. A drift layer 12 has a first surface on surface 31 of substrate 11. Substrate 11 and layer 12 together function as a drain of transistor 10, and layer 12 functions as a lightly doped region of the drain. Also, the doping and thickness of layer 12 is selected to facilitate transistor 10 sustaining a high breakdown voltage, as will be seen hereinafter. Typically, substrate 11 and layer 12 are formed from the same material, for example silicon carbide, gallium arsenide, or other III–V compounds. In the preferred embodiment, substrate 11 is N+ gallium arsenide and layer 12 is N− gallium arsenide that is epitaxially formed on substrate 11. In this embodiment, layer 12 has a doping concentration of approximately $3 \times 10^{14}$ to $7 \times 10^{16}$ atoms per cubic centimeter (atoms/cm$^3$) and a thickness of approximately one-half micron to fifty microns. This preferred embodiment also has a drain contact 26 on second surface 32 of substrate 11. Contact 26 is formed by methods well known to those skilled in the semiconductor art. Contact 26 can be one of many types of ohmic contacts that are well known in the art such as an alloyed multilayer structure of nickel, germanium, and gold.

A first blocking region 13 and a second blocking region 14 are formed on layer 12 and have a conductivity type that is opposite to that of layer 12. A first source region 16 and a second source region 17 are within blocking regions 13 and 14, respectively, and have a conductivity type that is opposite to the conductivity type of blocking regions 13 and 14. The depth or thickness of blocking regions 13 and 14 in addition to the relative doping concentrations between layer 12 and blocking regions 13 and 14 is determined by the source to drain voltage that transistor 10 is to withstand. In the preferred embodiment, blocking regions 13 and 14 are formed to have a P-type doping concentration of approximately $1 \times 10^{16}$ to $2 \times 10^{17}$ atoms/cm$^3$ by counter doping portions of layer 12. In this preferred embodiment, blocking regions 13 and 14 have a thickness of approximately eighty to sixteen hundred nanometers so that transistor 10 can withstand a voltage of at least twenty to six hundred volts.

The portion of blocking region 13 that extends from an edge of region 16 laterally near the surface of blocking region 13 to abut layer 12 forms a first channel region 20, illustrated by a dashed line. Similarly, a second channel region 21, illustrated by a dashed line, extends from an edge of region 17 to layer 12 near the surface of blocking region 14. The portion of layer 12 between channels 20 and 21 functions as a primary drain region 28 where the majority of current is concentrated.

A heterojunction layer 18 is formed on layer 12 to overlay region 28 and channels 20 and 21. Layer 18 is a material having a band gap that is larger than the band gap of the material used for layer 12 in order to form a heterojunction at the interface of layer 18 with channel regions 20 and 21. Suitable materials for layer 18 include, but are not limited to, aluminum gallium arsenide, aluminum nitride, and gallium nitride. In the preferred embodiment, layer 18 is aluminum gallium arsenide having an aluminum mole fraction of at least ten percent. Within layer 18, a charge supply region 19 (illustrated by a dashed line) is formed near the interface of layer 18 with channel regions 20 and 21. Region 19 is formed by modulation doping or other similar technique that forms a thin doped layer within a material. Modulation doping and other similar techniques are well known in the semiconductor art. Region 19 is a thin sheet of dopants that function as a carrier source for channel regions 20 and 21. Region 19 has a doping concentration that is higher than the doping concentration of regions 20 and 21. The distance of region 19 from the interface of layer 18 and regions 20 and 21 typically varies from about one to ten nanometers. It should be noted that the dopants in region 19 could also be spread throughout layer 18. In the preferred embodiment, region 19 is approximately three nanometers from the surface of layer 12 and has a doping concentration of approximately $1 \times 10^{12}$ to $5 \times 10^{12}$ atoms per square centimeter (atoms/cm$^2$). Because of the heterojunction, a discontinuity is created in the conduction band at the interface of layer 18 with channel regions 20 and 21. This conduction band discontinuity is used to capture carriers and form a two dimensional electron gas that provides transistor 10 with high transconductance.

A Schottky gate 22 on heterojunction layer 18 overlays channel regions 20 and 21 in order to provide control of current flow through regions 20 and 21. Ohmic source contacts 23 and 24 on regions 16 and 17, respectively, are adjacent to layer 18 in order to minimize the source region conduction path. Contacts 23 and 24 must extend to overlap the distal portion of regions 13 and 14, respectively, to prevent forming a parasitic bipolar transistor. Contacts 23 and 24 and gate 22 are formed by methods well known to those skilled in the semiconductor art. The material used for gate 22 depends on the material used for layers 12 and 18. For example, platinum or gold may be used for gate 22 when layers 12 and 18 are silicon carbide and aluminum nitride, respectively, or when layers 12 and 18 are silicon carbide and gallium nitride respectively. Another example includes using either titanium, aluminum, titanium tungsten, or titanium tungsten nitride for gate 22 when layers 12 and 18 are gallium arsenide and aluminum gallium arsenide, respectively. In the preferred embodiment, contacts 23 and 24 are a multi-layer structure of nickel, germanium, and gold.

When gate 22 is not negatively biased with respect to source contacts 23 and 24, and when drain contact 26 is biased positively with respect to source contacts 23 and 24, carriers from region 19 are transferred into channel regions 20 and 21 at the conduction band discontinuity to form a two dimensional electron gas. The two dimensional electron gas forms an inversion layer in channel regions 20 and 21 thereby supporting highly efficient current flow in regions 20 and 21. As shown by arrows 27, current flow is from contacts 23 and 24, through regions 20 and 21, respectively, into layer 12 and then vertically through layer 12 and substrate 11 to drain contact 26. Applying a negative bias to gate 22 depletes electrons from the conduction band discontinuity and reduces or stops current flow through transistor 10.

When a reverse bias is applied between contact 26 and contacts 23 and 24, a depletion region is formed in the P-N junction between layer 12 and regions 13 and 14, respectively. Because layer 12 is thick and has a relatively light doping, most of the depletion region is formed within layer 12. The width of the depletion region penetration into blocking regions 13 and 14 depends on the magnitude and ratio of doping between blocking regions 13 and 14 and layer 12. Since the forward operation of transistor 10 does not depend on the thickness of layer 12 and regions 13 and 14, these thicknesses can be established to withstand high voltages thereby providing transistor 10 with a high breakdown voltage. In the preferred embodiment, the doping profile of regions 13 and 14 gradually increase from a minimum doping at the surface to a maximum near the bottom. This profile facilitates confining the depletion region to the bottom portion of regions 13 and 14 and further minimizes the width of the depletion region. The preferred doping profile has a maximum doping concentration within regions 13 and 14 that is approximately five times the minimum.

Having the drain contact on the back of the transistor facilitates using thick blocking regions and a thick drift layer, thus, providing high breakdown voltage. The lateral arrangement between sources 16 and 17, channel regions 20 and 21, and region 28 facilitates using multiple channel regions. Because of the two channel regions, the current density or current carrying capability of transistor 10 is at least two times greater than prior transistors. Additionally, the structure represented by transistor 10 can be duplicated, and the duplicate structures connected in parallel in order to further increase the current carrying capability.

An alternate embodiment of transistor 10 utilizes a substrate 11 that has a conductivity type that is opposite to the conductivity of layer 12. The operation of the alternate embodiment is analogous to an insulated gate bipolar transistor. Current flow of the alternate embodiment utilizes the same conduction band discontinuity mechanism as transistor 10. The alternate embodiment has a very low forward resistance because of conductivity modulation resulting from forward biasing of the P-N junction between the substrate and the drift layer.

Additionally, it should be noted that blocking regions 13 and 14 could alternately be formed as planar epitaxial layers on layer 12 with an implant utilized to form the portion of the drift layer that is between the channels. This implant would separate the epitaxial layers into equivalents of blocking regions 13 and 14. Source regions typically would be formed as implants in the epitaxial layers.

By now it should be appreciated that there has been provided a novel transistor. Laterally displacing the source, the channel, and the drain and vertically displacing the drain contact facilitates utilizing multiple sources and channels and results in higher current carrying capability than prior transistors. Forming a two dimension electron gas provides the transistor with high transconductance. Providing a wide blocking region to drift layer P-N junction and positioning the junction away from the channel provides a high breakdown voltage that does not interfere with forward operation of the transistor.

We claim:

1. A modulation doped field effect transistor comprising:
   a substrate having a first surface;
   a drift layer of a first conductivity type having a first band gap and a first surface on the first surface of the substrate;
   a first blocking region of a second conductivity type on the second surface of the drift layer wherein the first blocking region is a doped region of the drift layer;
   a first source region of the first conductivity type within the first blocking region;
   a heterojunction layer on the drift layer, the heterojunction layer covering a portion of the first blocking region that is between an edge of the first blocking region and an edge of the source region wherein the heterojunction layer is formed from a material having a band gap that is larger than the first band gap;
   a charge supply region in the heterojunction layer, the charge supply region overlaying the first blocking region and adjacent to the first blocking region wherein the charge supply region has a doping concentration that is higher than a doping concentration within the first blocking region; and
   a Schottky gate on the heterojunction layer.

2. The transistor of claim 1 wherein the charge supply region has a doping concentration of between $1 \times 10^{12}$ and $5 \times 10^{12}$ atoms/cm$^2$.

3. The transistor of claim 1 wherein the first blocking region has a doping concentration of between $1 \times 10^{16}$ and $2 \times 10^{17}$ atoms/cm$^3$ and a thickness of approximately 80 to 1600 nanometers, and wherein the drift layer has a doping concentration of between $3 \times 10^{14}$ and $7 \times 10^{16}$ atoms/cm$^3$ and a thickness of approximately 0.5 to 50 microns.

4. The transistor of claim 1 wherein the first source region has a doping concentration of between $5 \times 10^{17}$ and $2 \times 10^{18}$ atoms/cm$^3$ and a thickness of approximately 50 and 100 nanometers.

5. The transistor of claim 1 wherein the heterojunction layer is aluminum gallium arsenide having an aluminum mole fraction of at least 10%.

6. The transistor of claim 1 wherein the blocking region, drift layer, and the substrate are gallium arsenide.

7. The transistor of claim 1 wherein the Schottky gate includes one of titanium, platinum, aluminum, titanium tungsten, titanium tungsten nitride, or gold.

8. The transistor of claim 1 wherein the substrate is of the first conductivity type.

9. The transistor of claim 1 wherein the substrate is of the second conductivity type.

10. The transistor of claim 1 further including:
a source contact on the first source region;
a drain contact on a second surface of the substrate;
a second blocking region of the second conductivity type on the second surface of the drift layer wherein the second blocking region is a doped region of the drift layer;
a second source region of the first conductivity type within the second blocking region wherein the charge supply region overlays and is adjacent to a portion of the second blocking region that is between an edge of the second blocking region and an edge of the second source region.

11. A semiconductor device comprising:
a source region;
a channel region laterally displaced from the source region, the channel region having a first band gap;
a heterojunction layer on the channel region and on the source region, the heterojunction layer having a second band gap that is larger than the first band gap; and
a charge supply region in the heterojunction layer and adjacent to the channel region, the charge supply region having a doping concentration that is higher than a doping concentration of the channel region.

12. The device of claim 11 wherein the doping concentration of the charge supply region is approximately $1 \times 10^{12}$ and $5 \times 10^{12}$ atoms/cm$^2$.

13. The device of claim 11 further including a Schottky gate on the heterojunction layer.

14. The device of claim 11 wherein the source region is one of gallium arsenide or silicon carbide.

15. The device of claim 11 wherein the heterojunction layer is one of aluminum gallium arsenide, aluminum nitride, or gallium nitride.

16. The device of claim 11 further including a drift region having a first portion laterally displaced from the channel region and a second portion underlying the channel region and the source region.

17. The device of claim 16 wherein the drift region has a doping concentration that is lower than a doping concentration within the channel region.

* * * * *